(12) United States Patent
Pooley et al.

(10) Patent No.: US 7,017,435 B2
(45) Date of Patent: Mar. 28, 2006

(54) HAND-HELD PROBING ADAPTER FOR A MEASUREMENT PROBING SYSTEM

(75) Inventors: William R. Pooley, Aloha, OR (US);
Scott R. Ketterer, Beaverton, OR (US);
Alan R. Wright, Fairview, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/856,290

(22) Filed: May 27, 2004

(65) Prior Publication Data

US 2005/0262953 A1 Dec. 1, 2005

(51) Int. Cl.
*G01D 21/00* (2006.01)
(52) U.S. Cl. ..................................... 73/866.5
(58) Field of Classification Search .............. 73/866.5, 73/431; 600/407
See application file for complete search history.

(56) References Cited

U.S. PATENT DOCUMENTS 6,704,670 B1 3/2004 McTigue

2004/0267109 A1* 12/2004 Dancel et al. .............. 600/407

\* cited by examiner

*Primary Examiner*—Hezron Williams
*Assistant Examiner*—Rodney T. Frank
(74) *Attorney, Agent, or Firm*—William K. Bucher

(57) ABSTRACT

A hand-held probing adapter secures a measurement probing system having a probe body coupled to a probing tip member via at least a first coaxial cable. The adapter has a housing with an interior cavity exposed at opening in opposing ends of the housing. The housing has a first portion at one end of the interior cavity for receiving the probe body and a second portion at the other end of the cavity for receiving the probing tip member. The first portion of the housing has means for securing the probe body in the housing, such as rib and slot combination. The second portion also has means for securing the probe tip member in the housing, such as with a pin in the interior cavity of the housing engaging a slot in the probe tip member. A portion of the probe tip member is exposed at one of the openings in the housing. Compliant members disposed in the second portion of the interior cavity providing axial and lateral rotation movement of the probing tip member.

23 Claims, 13 Drawing Sheets

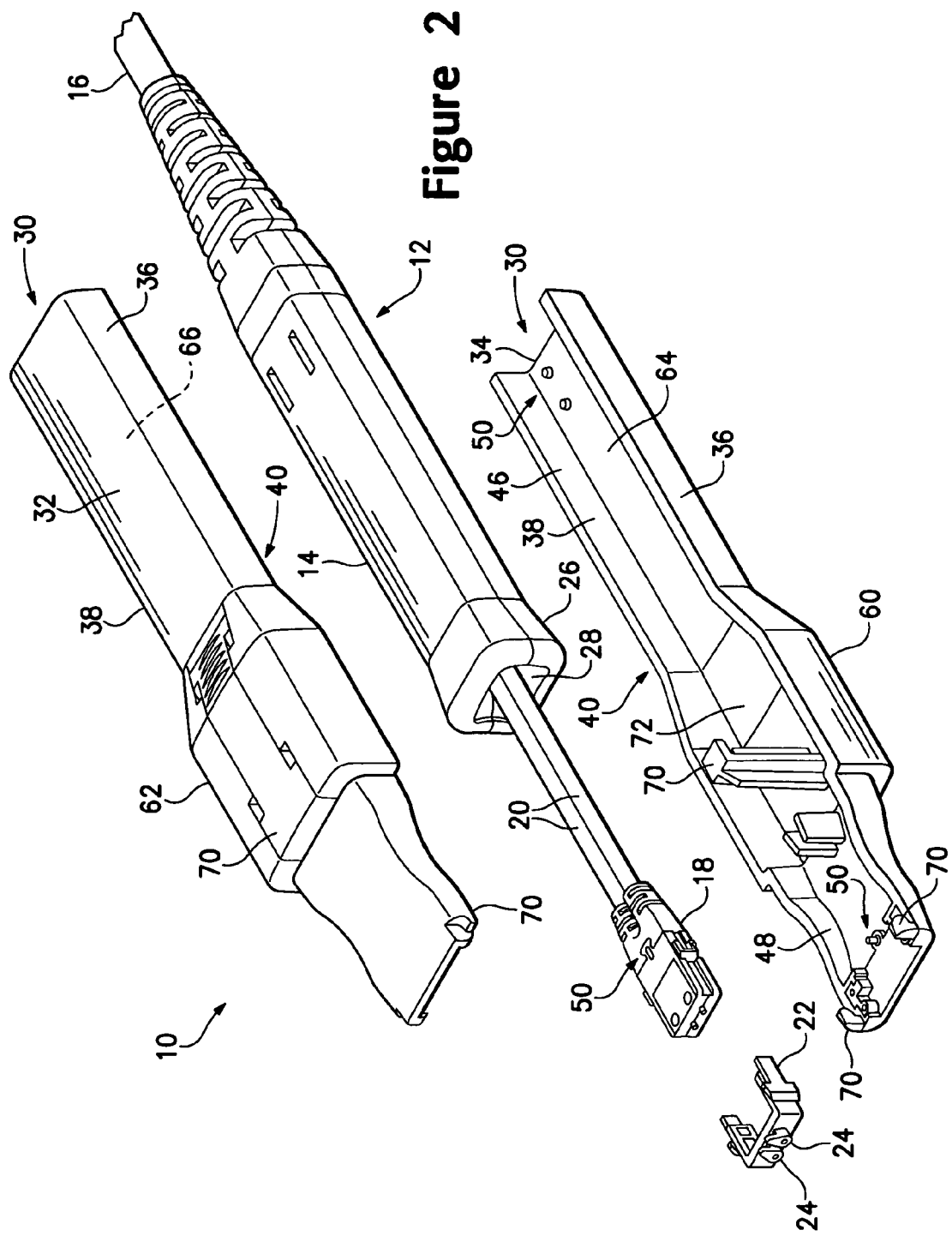

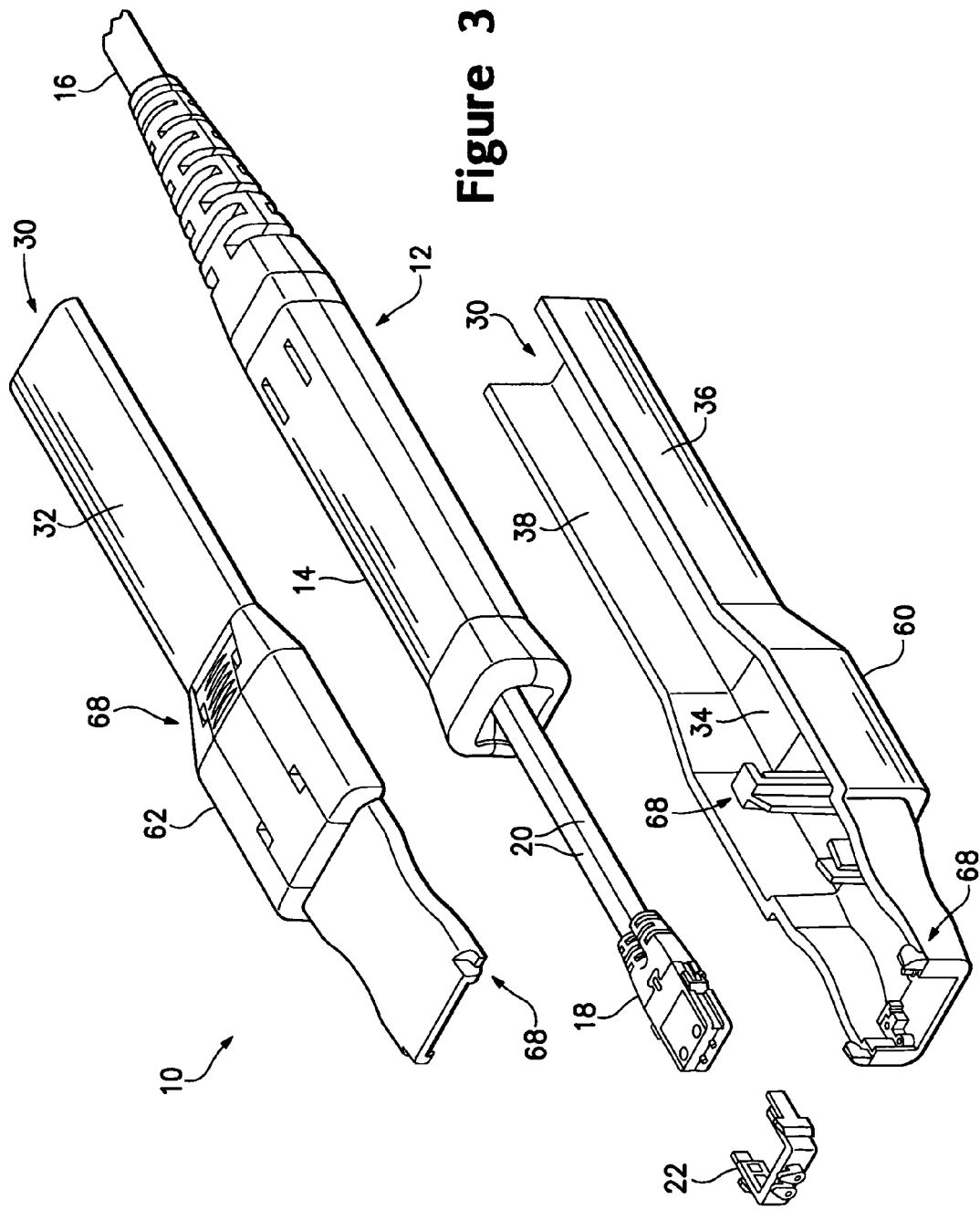

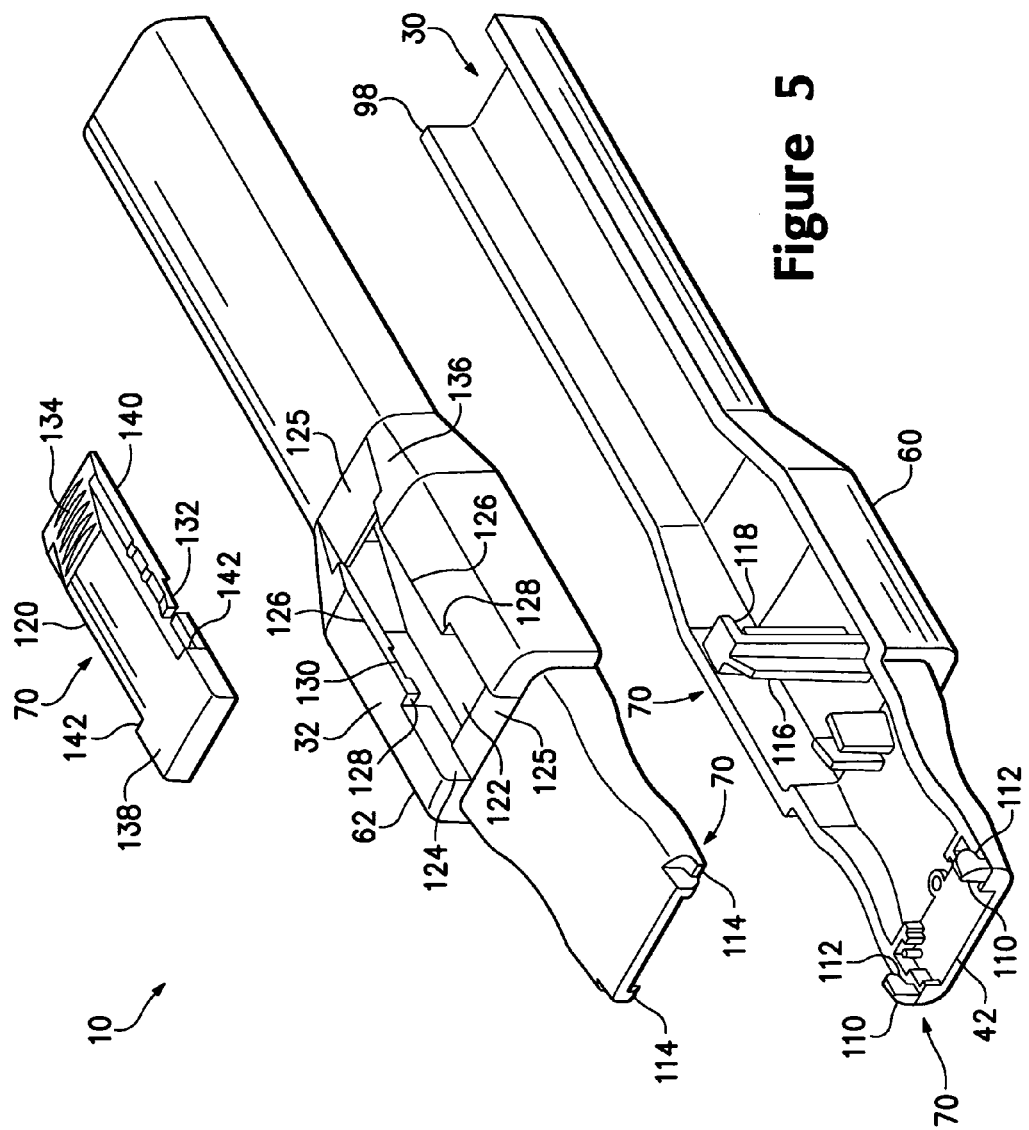

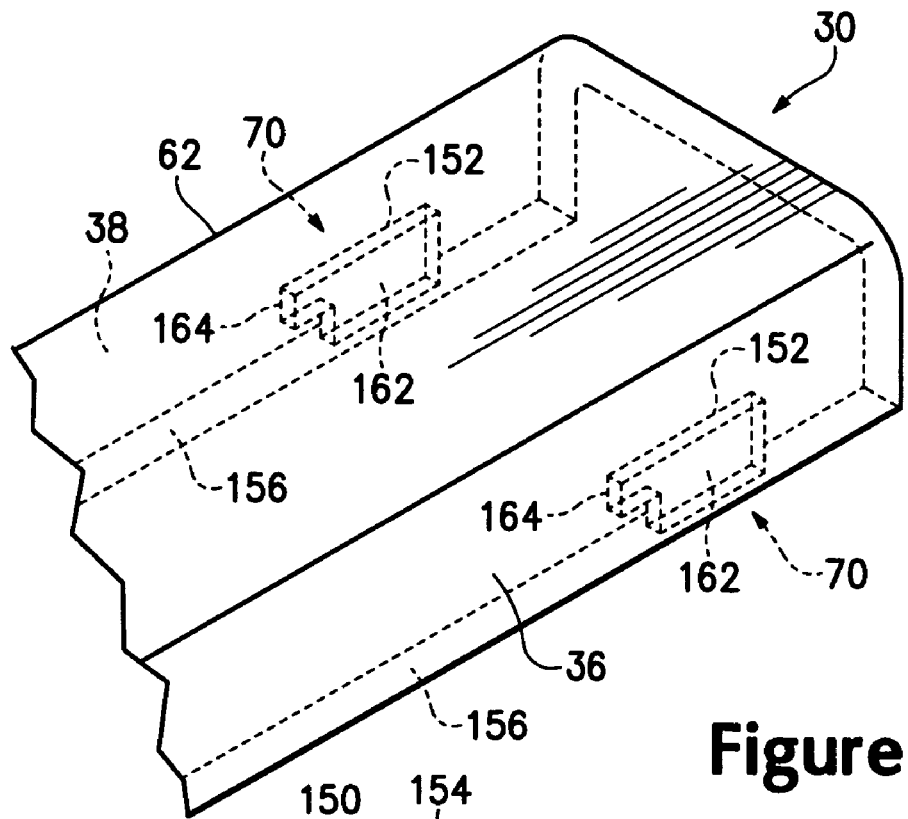
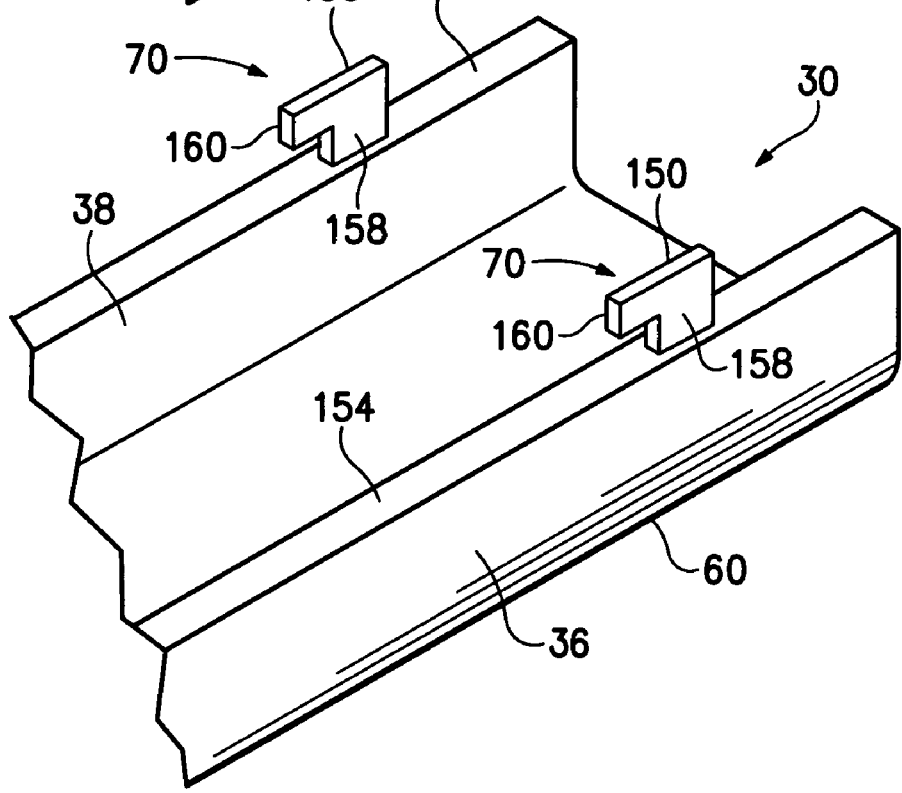
Figure 8

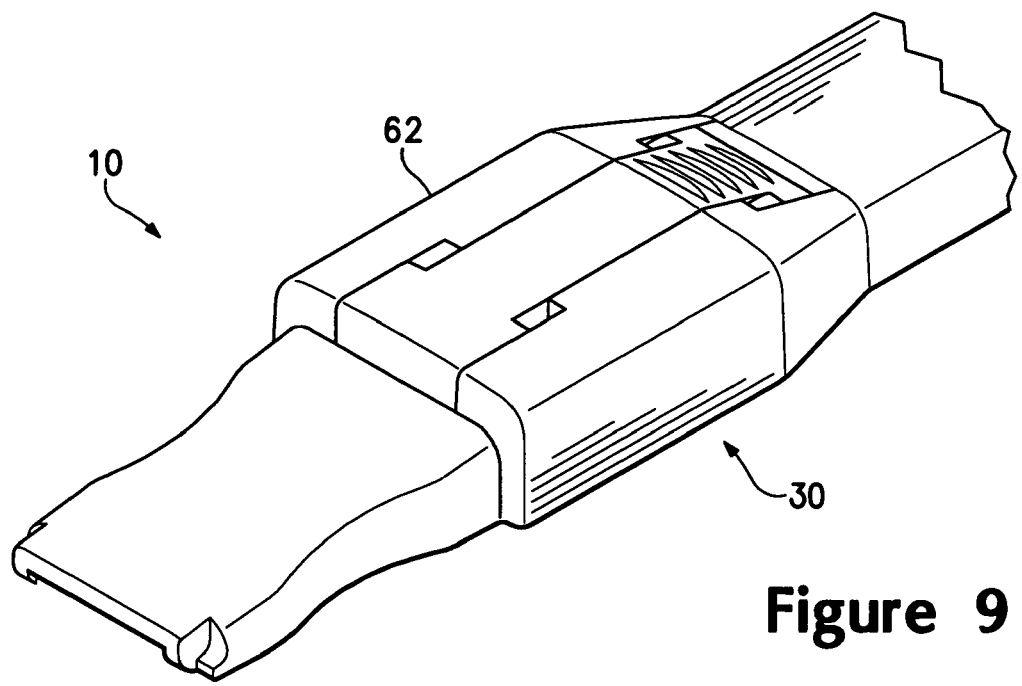
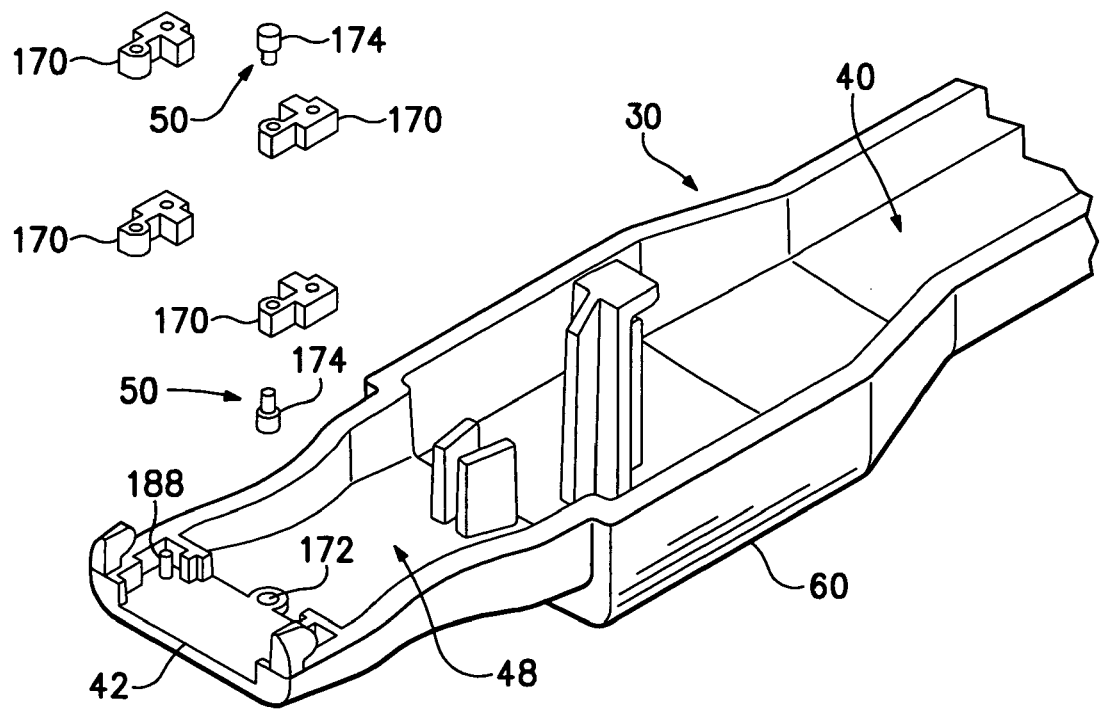
Figure 9

HAND-HELD PROBING ADAPTER FOR A MEASUREMENT PROBING SYSTEM

BACKGROUND OF THE INVENTION

The present invention generally relates to measurement probes and more particularly to a hand-held probing adapter for a measurement probing system.

As the bandwidth of measurement instruments, such as oscilloscopes and the like, increases, there is a corresponding need for measurement probes having equal or greater bandwidths. A major difficulty in designing very wide bandwidth measurement probes having bandwidths of 5 Ghz and greater is the effects of capacitance and inductance of the probing tip or tips. One solution to this problem is to separate the probing tips from the active circuitry in the probing head of the measurement probe. U.S. Pat. No. 6,704,670 describes a wideband active probing system where the probing tip or tips of the probe are separable from a probe amplifier unit. One or more probe cables are connected to a probe tip unit which are connected to the probe amplifier unit for conveying signals received by a probe unit. Various types of probe tip units may be connected to the probe amplifier unit. The probe tip unit may contain circuitry ranging from conductor traces to various resistive, capacitive, and/or other electronic elements. An advantage of such a probe design is that it allows the placement of the substantially smaller probe tip unit onto difficult to reach contacts on a device under test instead of a larger measurement probe containing probe amplifier circuitry.

One type of probe tip unit for the wideband active probing system is a differential probe unit. The differential probe unit includes a probe unit housing and probe assemblies. Each probe assembly includes a probe barrel, a probe barrel nose cone and a probing tip. The center conductor of the probe cable is electrically coupled to the probing tip and an outer shielding conductor of the probe cable is electrically coupled to the probe barrel. The probe barrels are partially disposed within the probe housing with the probe barrel nose cones attached to the respective probe barrels extending outward from the probe housing. The probing tips extend partially out of the respective probe barrel nose cones. The longitudinal axis of each probe barrel nose cone is offset at an angle from the longitudinal axis of its respective probe barrel. The probe barrels are rotatable within the probe unit housing. This allows the probing tips to be rotated to various separation distances to match the separation distances of probe points on a device under test. The differential probe unit further includes elastic compressible elements that allow the probe assemblies to move along the longitudinal axis of the probe barrels for mating with probe points of differing heights on the device under test.

While the above describe design is excellent for wideband probing, the overall performance may be affected by the use of attachable probe tip units. Each probe tip unit has particular electrical characteristics that need to be matched to the probe head amplifier or compensated for by calibration. If the electrical characteristics of the probe tip units are not compensated for by calibration, then the overall performance of the probing system may be downgraded. This then would require re-calibration of the probing system each time a different probe tip unit is attached to the probe head amplifier. A unitary measurement probing system where a single probe tip unit is permanently attached to the probe head amplifier via one or more coaxial cables would allow for the electrical characterization and generation of single set of calibration constants for the measurement probing system. Thus the measurement probing system would only need to calibrated with the measurement instrument at the time the measurement probing system is attached to the measurement instrument. However, such a measurement probing system would be limited to the design of the probe tip unit. For example, if the probe tip unit is designed for hand-held probing, such as the above described differential probe tip unit, then it would be difficult to physically attach the differential probe tip unit to the device under test via soldering or the like.

What is needed is a hand-held probing adapter for a measurement probing system having a permanently attached probe tip unit or member that allows the measurement probing system to be used for hand-held probing applications as well as applications where the probe tip member is fixedly attached to the device under test. The hand-held probing adapter needs to easily attachable and detachable from the measurement probing system. The hand-held probing adapter further needs to allow lateral rotational and axis movement of the probe tip member for making electrical contact with probing points of differing heights on the device under test.

SUMMARY OF THE INVENTION

Accordingly, the present invention is an adapter for a measurement probing system having a probe body coupled to a probing tip member via at least a first coaxial cable. The adapter has a housing with an interior cavity that is exposed at openings in opposing ends of the housing. The housing preferably has first and second housing members with at least one of the housing members having a chamber defining the interior cavity of the housing. In the preferred embodiment, the housing members are shell halves with each shell half defining a portion of the interior cavity of the housing. The interior cavity has a first portion that receives the probe body and a second portion that receives the probing tip member. Means are provided for securing the probe body and the probing tip member in the interior cavity of the housing with a portion of the probing tip member being exposed at the opening in the housing adjacent to the second portion of the interior cavity. Compliant members are disposed in the second portion of the interior cavity that provide axial and lateral rotational movement of the probing tip member. The housing further has means for latching the housing member together.

The latching means has interlocking latching members with each interlocking latching member having a first interlocking latching portion disposed with the first housing member and a second interlocking latching portion disposed with the second housing member. In the preferred embodiment, one of the interlocking latching members has a pedestal with a notch formed therein extending from the interior cavity of one of the shell halves and a movable actuator disposed on the other of the shell halves with a hook member that engages the notch in the pedestal as the actuator is moved from a first position to a second position. The other interlocking latching member has notched beams disposed on one of the shell halves adjacent to and on opposing sides of the opening in the housing receiving the probing tip member with the other of the shell halves having recesses formed adjacent to and on opposing sides of the opening in the housing receiving the probing tip member wherein each of the notched beams on the one shell half receives one of the recesses in the other shell half.

In an alternative embodiment, the interlocking latching members are disposed on mating surfaces of the first and second shell halves. The first interlocking latching portion of each interlocking latching member extends upward from one of the mating surfaces and has a laterally extending hooked element formed therein. The second interlocking latching portion of each interlocking latching member is disposed in the second mating surface and has a chamber with a recessed shoulder. The laterally extending hooked element of the first latching portion engages the shouldered chamber in the second latching portion as the mating surfaces of the first and second shell halves are brought together in mating contact and laterally moved from a first position to a second position.

The probe body preferably has at least a slot and/or a rib disposed on an exterior surface of the probe body that mates with at a corresponding rib and/or slot formed in the first portion of the interior cavity to secure the probe body in the housing. The probe body may also have at least one set of protruding studs that mate with a slot or corresponding apertures formed in the first portion of the interior cavity. Alternately, the set of protruding studs may be formed in the first portion of the interior cavity and mate with a slot or apertures formed on an exterior surface of the probe body. In a further alterative embodiment, lateral protrusions extend into the first portion of the interior cavity for capturing the probe body between the protrusions.

The probing tip member has at least a first slot formed therein and the housing has at least a first pin disposed in the second portion of the interior cavity that engages the slot in the probing tip member for securing the probing tip member in the second portion of the interior cavity. Preferably, the probing tip member has slots formed in opposing top and bottom surfaces and the housing has pins disposed on opposing interior surfaces in the second portion of the interior cavity that engage the slots on the opposing top and bottom surfaces of the probing tip member.

The compliant members are preferably formed of an elastomeric material and disposed in the second portion of the interior cavity adjacent to opposing sides of the probing tip member. Each compliant member has a first portion engaging a rearward facing end face of a protrusion on each of the opposing sides of the probing tip member and a second portion engaging a side surface of the protrusion on each of the opposing sides of the probing tip member.

The objects, advantages and novel features of the present invention are apparent from the following detailed description when read in conjunction with appended claims and attached drawings.

BRIEF DESCRIPTION OF THE DRAWINGS

FIGS. 1 and 2 are perspective views of the hand-held probing adapter for a measurement probing system according to the present invention.

FIG. 3 is a perspective view of an alternative configuration of the hand-held probing adapter according to the present invention.

FIG. 5 is an exploded perspective view of the interlocking latching members of the hand-held probing adapter according to the present invention.

FIG. 8 illustrate an alternative embodiment of the interlocking latching members in the hand-held probing adapter according to the present invention.

FIG. 9 is an exploded perspective view of the front portion of the hand-held probing adapter 10 according to the present invention.

DETAILED DESCRIPTION OF THE PREFERRED EMBODIMENT

Figure 1:
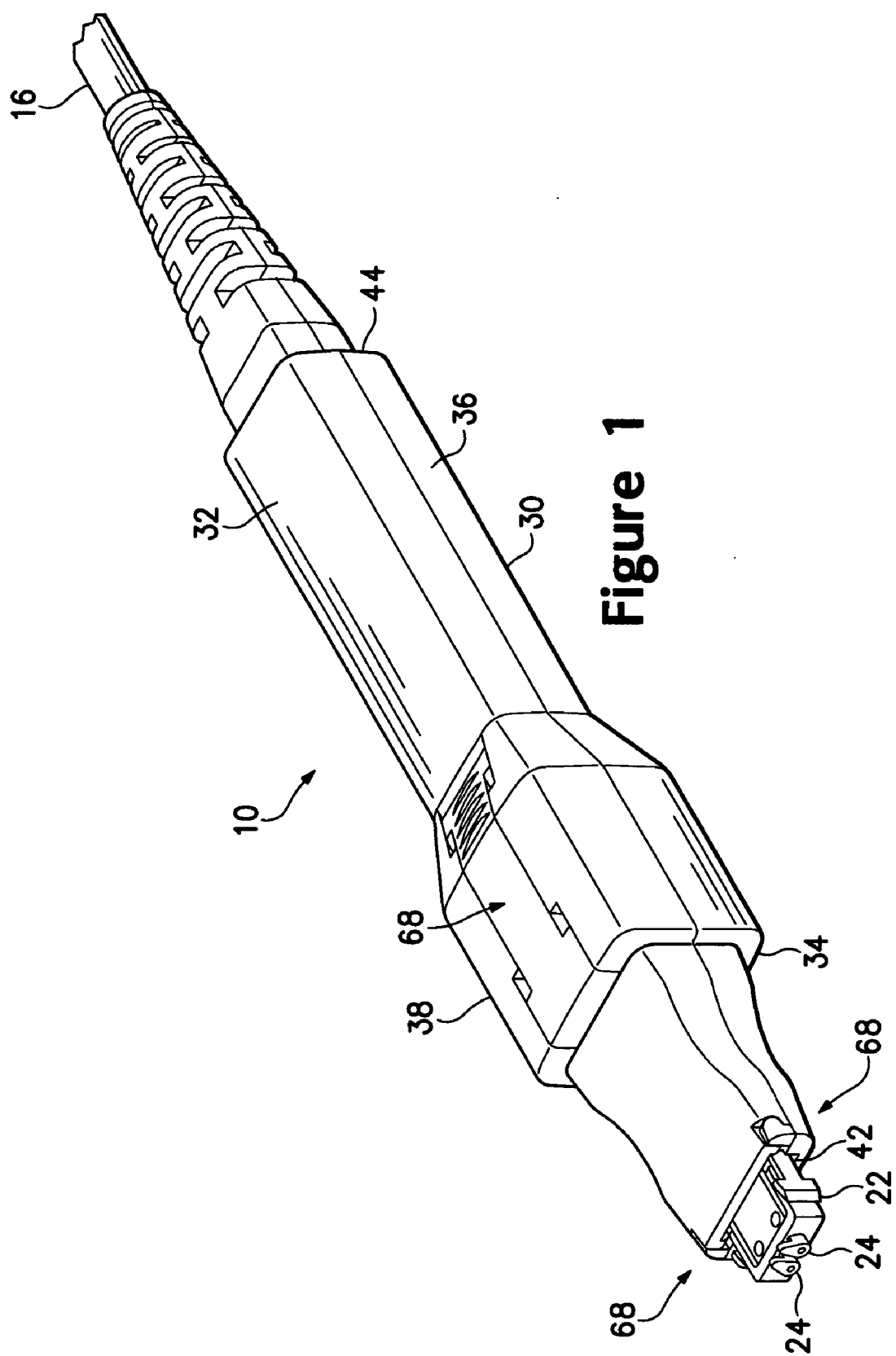

Referring to FIGS. 1 and 2, there are shown perspective views of the hand-held probing adapter 10 of the present invention for a measurement probing system 12. The measurement probing system 12, as shown in FIG. 2, has a probe body 14 preferably containing active circuitry. The probe body 14 is electrically coupled to a measurement test instrument (not shown), such as an oscilloscope or the like, via a coaxial cable 16. The coaxial cable 16 also contains power and signal lines that provide electrical power to the active circuitry in the probe body 14 and communication signals to and from the probe body 14 for controlling the active circuitry. A probing tip member 18 that preferably provides differential measurement capabilities is coupled to the probe body 14 via first and second coaxial cables 20. The probing tip member 18 has various probing tip clips 22 that are slidably mated to the probing tip member 18 and accept various probing tips 24. Alternately, the probing tip member 18 may be a single ended probing device and has a single coaxial cable 20 coupling it to the probe body 14. In the depicted example of the measurement probing system 12, the probe body 14 has an elongated, substantially rectangular shape with an enlarged region 26 at one end accommodating an inverted strain relief 28 for the coaxial cables 20 extending to the probing tip member 18. The probing tip member 18 has a substantially rectangular shape with the height of the probing tip member being substantially less than the length and the width.

The hand-held probing adapter 10 has a housing 30 having top and bottom members 32, 34 and opposing sidewalls 36, 38 defining an interior cavity 40 that receives the measurement probing system 12. The interior cavity 40 of the housing 30 is exposed at openings 42, 44 at opposing ends of the housing 30. The interior cavity 40 of the housing has a first portion 46 that extends to one of the opening 44 in the housing 30 and closely receives the probe body 14. A second portion 48 extends to the other opening 42 in the housing 30 and closely receives the probing tip member 18. The probing tip member 18 preferably extends past the end of the housing 30. The housing 30 is formed of an injection-moldable non-conductive material, such as ABS plastic, ABS-polycarbonate blend or the like. Various features 50 may be formed or positioned in the first and second portions 46, 48 of the interior cavity 40 that mate with features formed in the probe body 14 and probing tip member 18 for securing the probe body 14 and probing tip member 18 within the interior cavity 40 of the housing 30. The various features 50 will be described in greater detail below.

In the preferred embodiment, the housing 30 is formed of first and second housing members 60, 62 with one of the housing member 60 having the bottom member 34 and portions of the sidewalls 36, 38 and the other housing member 62 having top member 32 and the other portions of the sidewalls 36, 38. The top and bottom members 32, 34 with the respective portions of the sidewalls 36, 38 form chambers 64, 66 in the first and second housing members 60, 62 defining portions of the interior cavity 40 of the housing 30. The housing 30 includes latching means 68 having interlocking latching members 70 for securing to first and second housing members 60, 62 together. Various types of interlocking latching members 70 can secure the first and second housing members 60, 62 together and will be discussed in greater detail below. The overall shape of the housing 30 is configured for the shape of the measurement probing system 12. In the preferred embodiment, the top and bottom member 32, 34 and the sidewalls 36, 38 of the housing are flared outward between the first and second portions 46, 48 of the interior cavity 40 thus forming an intermediate interior cavity portion 72 that contains the latching means 68 and coaxial cables 20. The intermediate interior cavity portion 72 is flared outward from the first portion 46 of the interior cavity 40 to accommodate the inverted strain relief 28 and transitions down to the second portion 48 of the interior cavity 40.

FIG. 3 is a perspective view of an alternative configuration of the first and second housing members 60, 62 of the housing 30. One of the housing members 60 has the base member 34 and the sidewalls 36, 38 and the other housing member 62 has the top member 32 acting as a cover. The sidewalls 36, 38 have a height that extends above the measurement probing system 12 disposed in the housing member 60. The cover housing member 62 is mated with the other housing member 60 and secured together using the latching means 68.

Figure 4A:
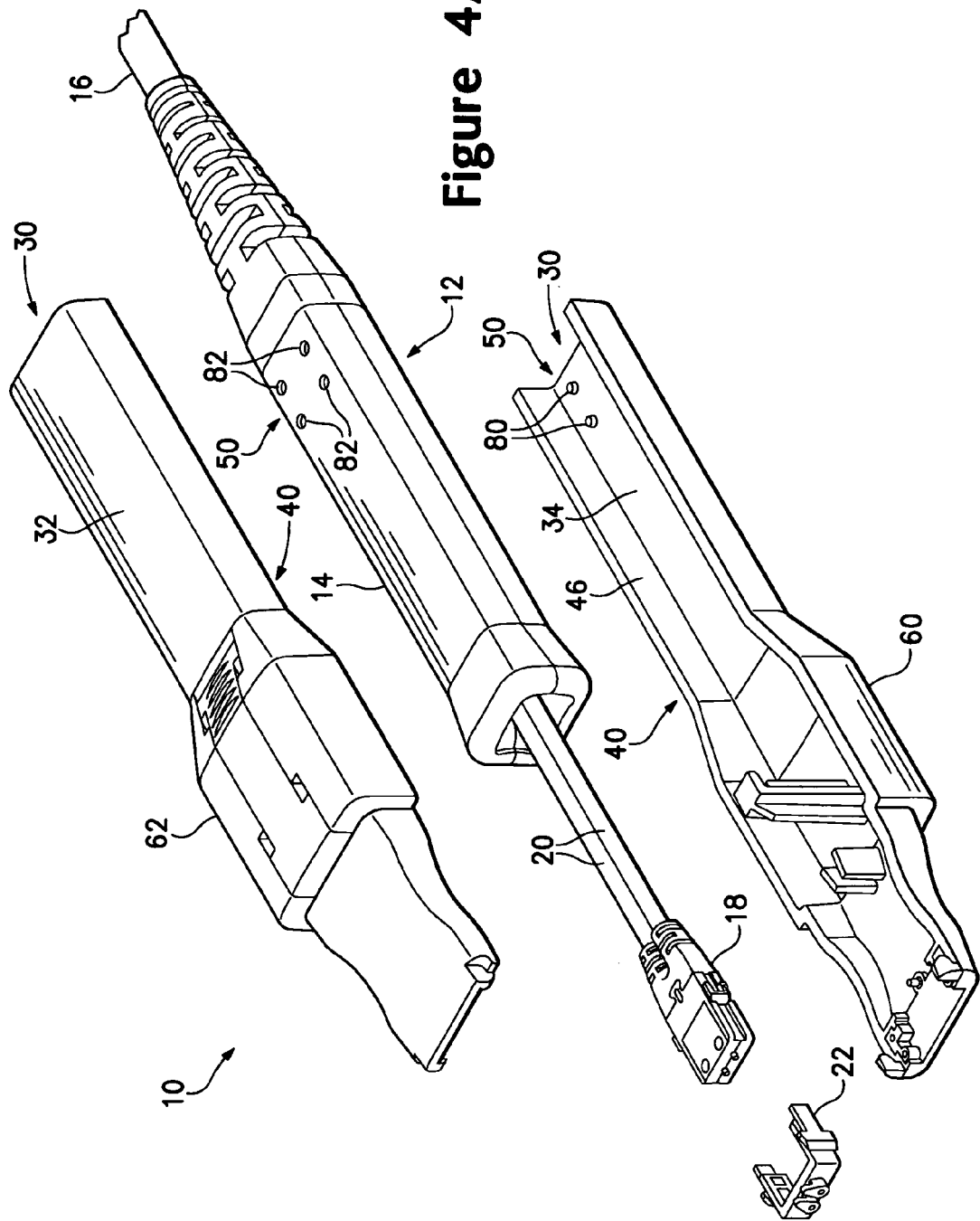
FIGS. 4A through 4D are perspective views illustrating various features for securing the probe body of the measurement probing system in the hand-held probing adapter according to the present invention.
Figure 4B:
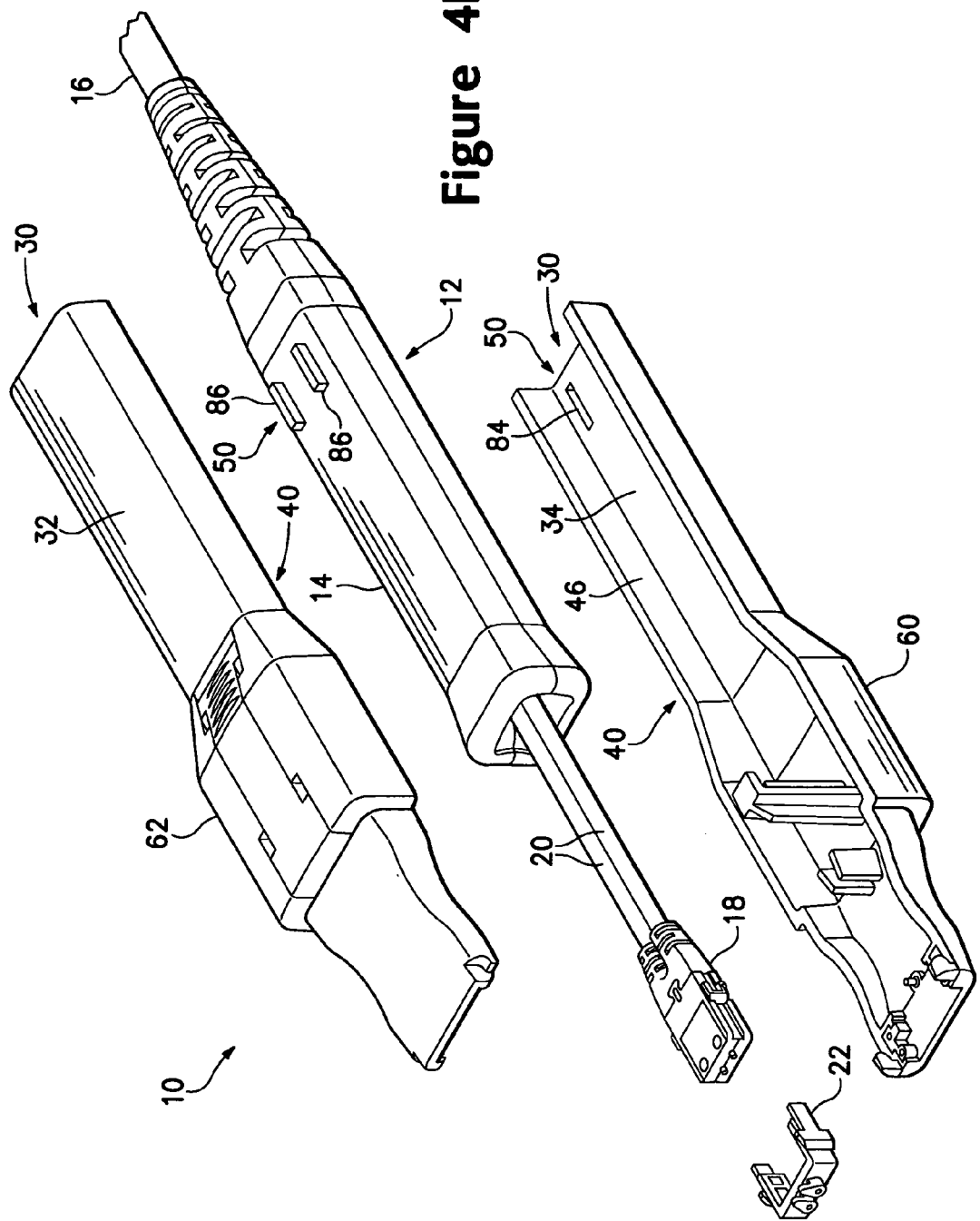
Figure 4C:
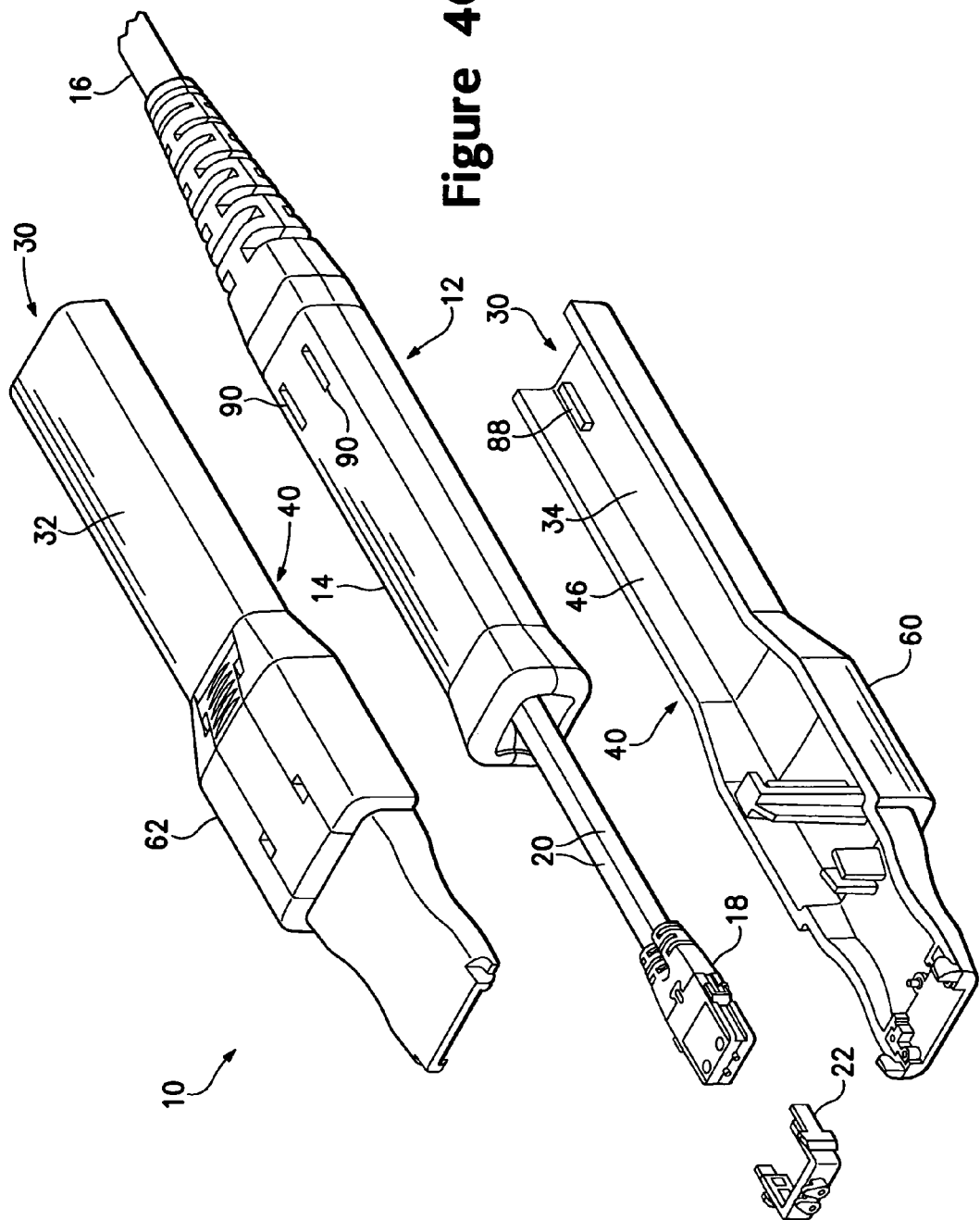
Figure 4D:
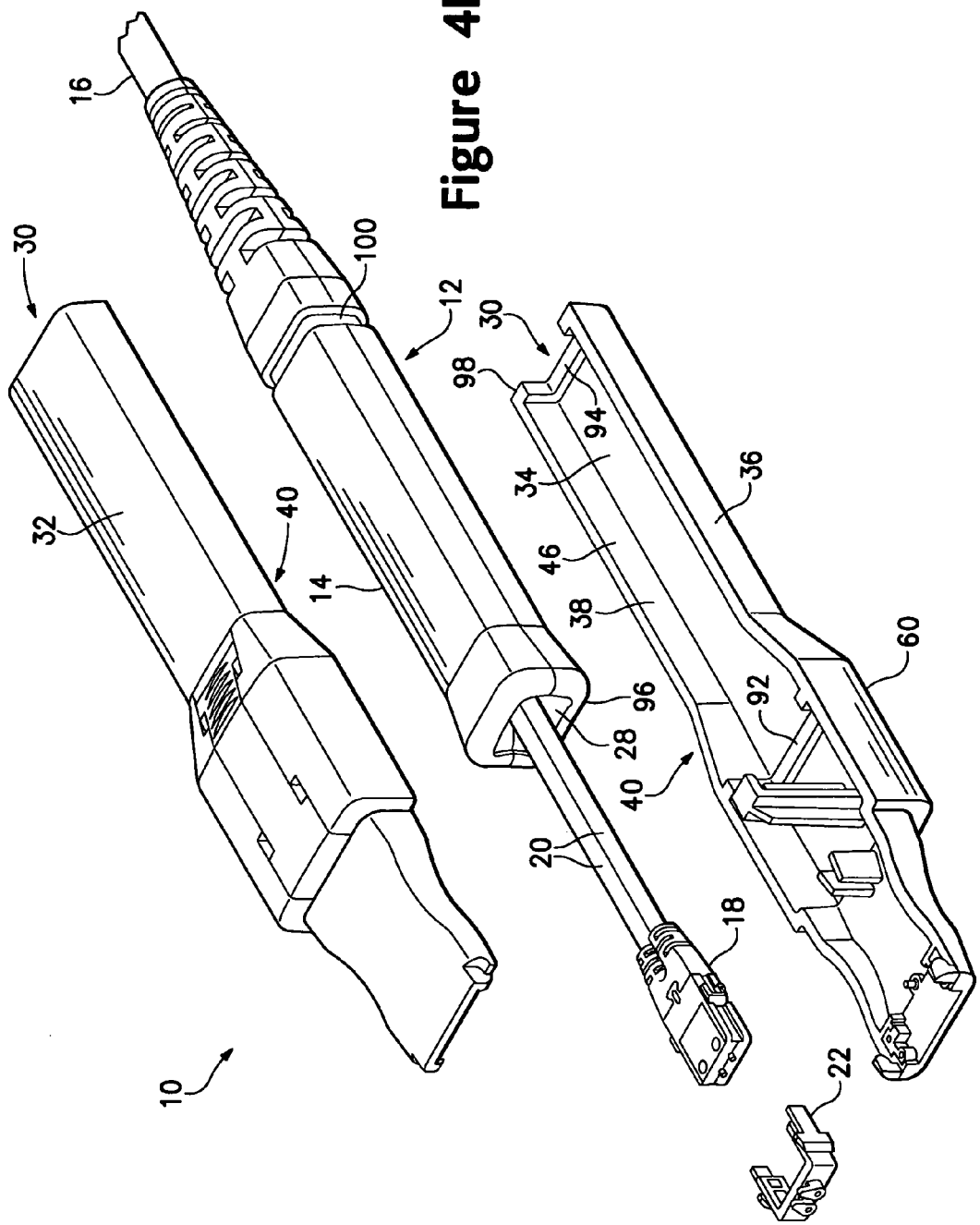

FIGS. 4A, 4B, 4C and 4D are perspective views of the hand-held probing adapter 10 and the measurement probing system 12 illustrating various features 50 in the hand-held probing adapter 10 for securing the probe body 14 in the adapter 10. In FIG. 4A, at least a first stud 80 is formed on positioned in the first portion 46 of the interior cavity 40 of the housing 30 which mates with a corresponding aperture 82 formed in the probe body 14. Preferably multiple sets of parallel studs 80 are formed in the top and base members 32, 34 of the housing members 60, 62 that mate with corresponding sets of parallel apertures 82 formed in the probe body 14. In FIG. 4B, at least a first slot 84 is formed in the second portion 46 of the interior cavity 40 of the housing 30 that mates with a corresponding rib 86 formed in the probe body 14. As with the first example, it is preferable to form sets of parallel slots 84 in the top and base members 32, 34 of the housing members 60, 62 that mate with sets of parallel ribs 86 formed in the probe body 14. In FIG. 4C, at least a first rib 88 is formed in the second portion 46 of the interior cavity 40 of the housing 30 that mates with a corresponding slot 90 formed in the probe body 14. Again, it is preferable to form sets of parallel ribs 88 in the top and base members 32, 34 of the housing members 60, 62 that mate with sets of parallel slots 90 formed in the probe body 14. In FIG. 4D, lateral protrusions 92, 94 extend into the interior cavity 40 for capturing the probe body 14 within the interior cavity 40 of the housing 30. As illustrated, one of the lateral protrusions 92 extends from the sidewalls 36, 38 and engages the end face 96 of the probe body 14 at the inverted strain relief 28. The other lateral protrusion 94 extends from the distal end 98 of the interior cavity 40 and engages a circumferential slot 100 formed in the probe body 14. Alternately, the probe body 14 may be formed with multiple circumferential slots with the protrusions extending into the interior cavity engaging these circumferential slots. The above described means for securing the probe body 14 in the housing 30 are by example only and other types of securing fixtures may be used. Further, above described securing means may be combined to secure the probe body 14 in the housing 30. In the preferred embodiment of the invention, multiple sets of studs 80 are formed in the top and base members 32, 34 of the housing members 60, 62 that mate with slots 90 formed in the probe body 14.

FIG. 5 is an exploded perspective view of the hand-held probing adapter 10 illustrating the interlocking latching members 70. A pair of upwardly projecting notched beams 110 are formed in one of the housing members 60 on opposing sides of the probing tip member opening 42 in the housing 30. The notches 112 in the beams 110 face toward the distal end 98 of the adapter 10 and extend from the mating surfaces of the housing member 60. A pair of forward facing recesses 114 are formed in the other housing member 62 on opposing sides of the probing tip member opening 42 in the housing 30.

Figure 7:
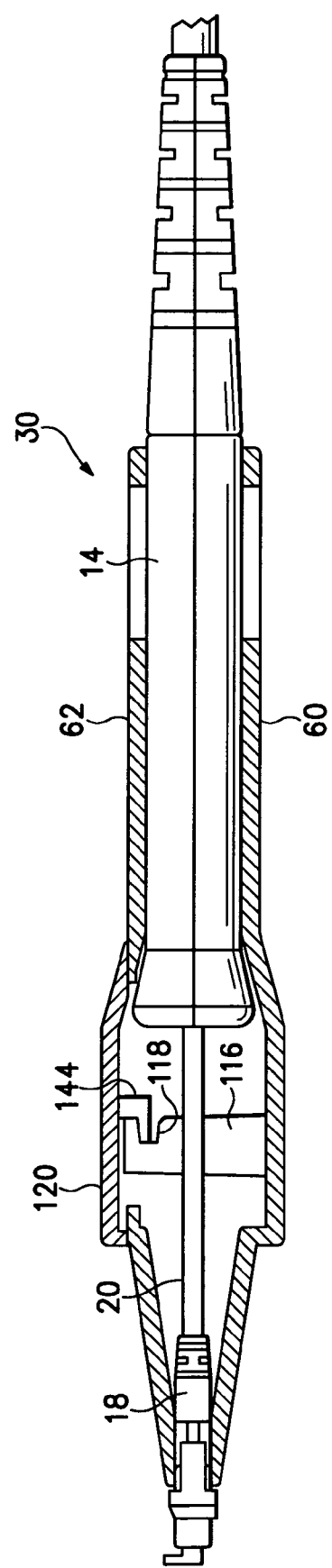
FIG. 7 is side sectional view of the hand-held probing adapter according to the present invention illustrating the second interlocking latching members.

A pedestal 116 is formed or positioned in the intermediate interior cavity portion 72 of one of the housing members 60. Preferably, the pedestal 116 is integrally formed with the housing member 60 during the manufacture of the part using an injection molding process. The pedestal 116 is formed with a rearward facing notch 118 proximate the upper end of the pedestal 116. The other housing member 62 receives a slidable actuator 120 that is positioned over an opening 122 formed in the top member 32 of the housing member 62 that exposes the intermediate interior cavity portion 72. A recess 124 is formed in the surface of the top member 32 having an essentially flat surface 125 in which the opening 122 is formed. Intermediate shoulders 126 are formed on opposing sides of the recess 124 that extend into the recess forming respective stops 128 in the sides of the recess 124. Notches 130 are formed on the underside of the intermediate shoulders 126 that receive biased detent latches 132 formed on the slidable actuator 120. The slidable actuator 120 is generally rectangular in shape having a sloped rear portion 134 matching the flared top surface 136 of the housing 30. Portions of the opposing side surfaces of the actuator 120 away from the front portion 138 of the actuator are notched forming shoulders 140 that extend from vertical end walls 142 formed in the front portion 138 of the actuator by the notches to the sloped rear portion 134. Part way along the shoulders 140 are formed the bias detent latches 132. A hook shaped member 144 (as shown in FIG. 7) is disposed on the under side of the actuator 120 that engages the notch 118 on the pedestal 116. The slidable actuator 120 is positioned in the recess 124 formed in the top member 32 with the bottom surfaces of the intermediate shoulders 126 on the opposing sides of the recess 124 slidably mating with the top surfaces of the shoulders 140 formed in the actuator 120. The bottom surfaces of the front and sloped rear portions 138, 134 of the actuator 120 slidably mate with the flat surface 125 of the recess 124. The interlocking latching members 70 have been described in relation to the specific housing members 60, 62. However, the notched beams 110 on housing member 60 may equally be formed on the housing member 62 and the recesses 114 formed on the housing member 62 may be formed on the housing member 60. Likewise, the notched pedestal 116 may be formed or positioned in the housing member 62.

Figure 6:
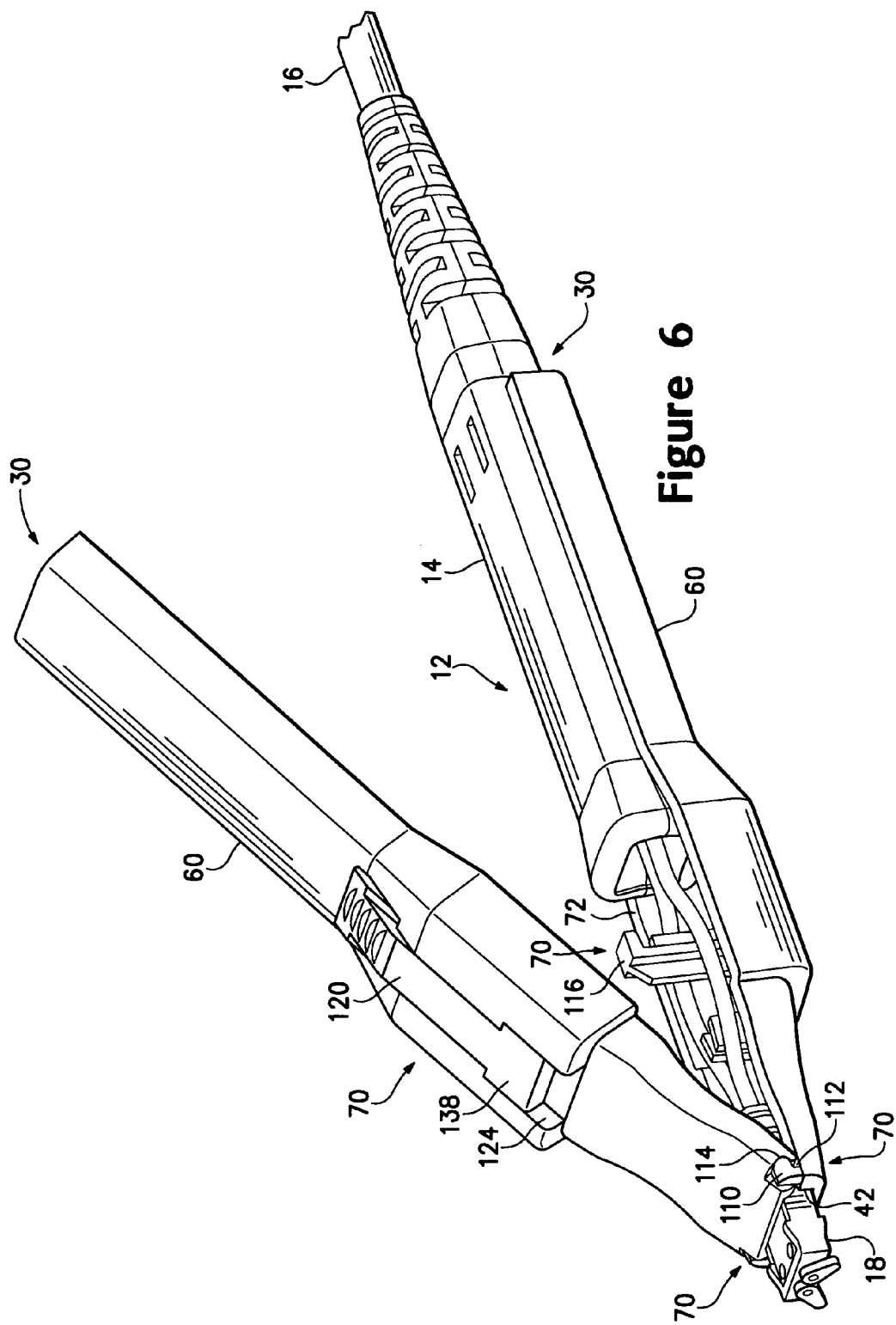
FIG. 6 is perspective view illustrating the latching of the first interlocking latching members of the hand-held probing adapter according to the present invention.

Referring to FIG. 6, there is shown a perspective view illustrating the latching of the interlocking latching members 70 on the first and second housing members 60, 62. The measurement probing system 12 is shown positioned in the lower housing member 60, with the pair of upwardly projecting notched beams 110 on the opposing sides of the probing tip member opening 42 in the housing 30 and the notched pedestal 116 disposed in the intermediate interior cavity portion 72. The slidable actuator 120 in the upper housing member 62 is in the rearward or open position with the vertical end walls 142 of the front portion 138 of the actuator engaging the ends of the intermediate shoulders 126 formed on the opposing sides of the recess 124. The upper housing member 62 is angled with respect to the lower housing member 60 to allow the forward facing recesses 114 formed on the opposing sides of the probing tip member opening 42 to engage the notches 112 in the upwardly projecting notched beams 110. The upper housing member 62 is brought together with the lower housing member 60 such that the end surfaces of the sidewall portions of the housing members 60, 62 are in mating contact as shown in side-sectional views of FIG. 7. In FIG. 7, the slidable actuator 120 is shown in the forward or closed position with the hook shaped member 144 on the underside of the actuator 120 engaging the notch 118 in the pedestal 116.

FIGS. 8 illustrates an alternative embodiment for the interlocking latching members 70 of the hand-held probing adapter 10. In FIG. 8, the interlocking latching members 70 have first and second interlocking latching portions 150, 152 disposed on mating surfaces 154, 156 of the respective housing members 60, 62. Each of the first interlocking latching portions 150 has a protrusion 158 extending upward from the mating surface 154 and a lateral extension forming a hook portion 160. The first interlocking latching portions 150 may be integrally formed with one of the housing members 60, 62. Alternately, the first interlocking latching portions maybe formed of a high strength material, such as brass, steel or the like, that is secured in a slot formed in the mating surface 154 of the housing member 60. Each of the second interlocking latching portions 152 has a chamber 162 extending into one of the sidewalls 36, 38 from the mating surface 156 with the chamber 162 having a laterally extending recess forming a shouldered region 164. Like the first interlocking latching portions, the second interlocking latching portions may be formed of a high strength material, such as brass, steel or the like, that is secured in a chamber extending from the mating surface 156 into the sidewalls 60, 62. Multiple interlocking latching members 70 may be positioned on the mating surfaces 154, 156 in parallel alignment with each other. The first and second housing members 60, 62 are brought together in mating contact at the mating surfaces 154, 156 with the hook shaped protrusion 158 of the first interlocking latching portions 150 disposed within the chamber 162 of the second interlocking latching portions 152. The first and second housing members 60, 62 are moved laterally such that the hook portions 160 of the first interlocking latching portions 150 engages the shouldered region 164 in the chamber 162 of the second interlocking latching portions.

Other types of interlocking latching members may be used with the hand-held probing adapter of the present invention. For example, the sidewalls portions 36, 38 of one of the housing members 62 may overlap the sidewalls portions 36, 38 of the other housing member 60 with the overlapping sidewall surfaces of the housing member 62 having a slot that receives a mating rib formed on the other overlapping sidewall surface of the housing member 60.

Another example is the housing member 62 having series of outwardly extending protrusions on the sidewalls 36, 38 that overlap portions of the sidewalls 36, 38 of the housing member 60 with the protrusions having inwardly facing laterally extending slots in the overlapped regions that mate with a corresponding series of the laterally extending shouldered ribs on the housing member 60.

Figure 10:
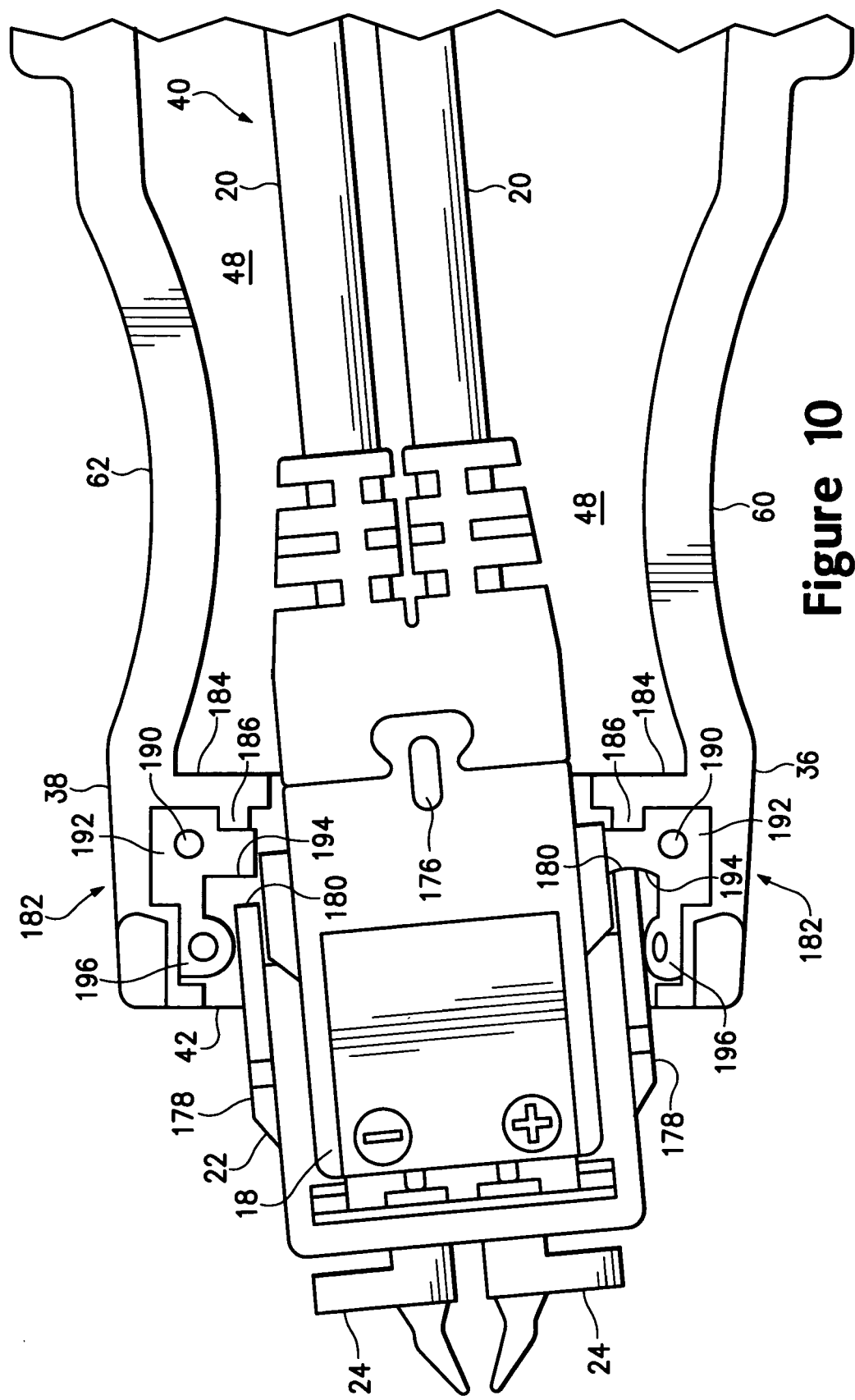
FIG. 10 is an exposed plan view of the front portion of the hand-held probing adapter 10 according to the present invention.

FIG. 9 is an exploded perspective view of the front portion of the hand-held probing adapter 10 illustrating the features 50 for securing the probing tip member 18 within the second portion 48 of the interior cavity 40 and compliant members 170 that provide axial and lateral rotational movement of the probing tip member 18. In the preferred embodiment, each housing 60, 62 has an aperture 172 formed in the second portion 48 of the interior cavity 40. A pin 174 formed of a high strength material, such as brass, aluminum, steel or the like, is disposed in the aperture 172 with a portion of the pin 174 extending into the interior cavity 40. The exposed portion of the pins 174 are positioned in slots 176 formed in the opposing top and bottom surfaces of the probing tip member 18, as shown in FIG. 10. The longitudinal axis of the slots 176 are parallel to the longitudinal axis of the hand-held probing adapter 10 for allowing axial movement of the probing tip member 18 relative to the adapter 10. Alternately, the pins 174 may be integrally formed in the second portion 48 of the interior cavity 40 during the injection molding process of the housing 30. Further, whereas the preferred embodiment pins 174 disposed in both housing members 60, 62, the probing tip member 18 may be secured within the interior cavity 40 using a single pin 174 engaging a single slot 176 formed in the probing tip member 18.

Referring to FIG. 10, there is shown an exposed plan view of the front portion of the hand-held probing adapter 10 with the probing tip member 18 disposed in the second portion 48 of the interior cavity 40. The probing tip clip 22 of the probing tip member 18 has opposing arms 178 that mate with the sides of the probing tip member 18 forming protrusions on the sides of probing tip member 18 having rearward facing end faces 180. The compliant members 170 are disposed in frames 182 formed in the interior cavity 40 adjacent to and on opposing sides of the opening 42 in the housing 30. Each frame 182 includes a portion of one of the sidewalls 36, 38 of the housing members 60, 62 and a protrusion 184 extending into the cavity 40 substantially normal to the sidewalls 36, 38 with a forward facing shoulder 186. Disposed within each frame 182 is a pin 188 that is received in a bore 190 formed in each of the compliant members 170. Each compliant member 170 has a polygonal shaped first portion 192 containing the bore 190 and side surfaces abutting one of the sidewalls 36, 38 and the shouldered protrusion 184. The polygonal shaped first portion 192 also has orthogonal sidewalls with one of the orthogonal sidewalls extending perpendicular from the sidewall abutting protrusion 184 defining a shouldered seat 194 facing the opening 42. Integrally formed with the polygonal shaped first portion 192 is a convex-semicircular shaped second portion 196 extending away from and perpendicular to the shouldered seat 194. The radius of the convex-semicircular shaped second portion 196 is less than the length of the shouldered seat 194 which recesses the apex of the convex-semicircular shaped second portion 196 back from the front edge of the shouldered seat 194. The compliant contacts 170 are preferably formed of an elastomeric material, such as a silicon material or the like.

The probing tip member 18 is positioned in the second portion 48 of the interior cavity 40 with rearward facing end faces 180 of the opposing arms 178 of the probing tip clip 22 abutting the shouldered seats 194 of the compliant members 170. The side surfaces of the opposing arms 178 abut the convex-semicircular shaped second portion 196 of the compliant members 170. Axial displacement of the probing tip member 18 during probing of a device under test is taken-up by the end faces 180 of the opposing arms 178 of the probing tip clip 22 compressing the shouldered seats 194 of the compliant members 170. Likewise, lateral rotation displacement of the probing tip member 18 is taken-up by the side surfaces of the opposing arms 178 of the probing tip clip 22 compressing the convex-semicircular shaped second portion 196 of the compliant members 170.

The above hand-held probing adapter 10 has been described in relation to a specific configuration of the measurement probing system 12. For example, the probe body 14 was described as having an elongated, substantially rectangular shape with an enlarged region 26 at one end accommodating an inverted strain relief 28 for the coaxial cables 20 extending to the probing tip member 18. The probe body 14 may equally have a elongated circular or oval shape with the first portion 46 of the interior cavity 40 having a corresponding circular or oval shape. Further, the shape of the probe body 14 and the probing tip member 18 are not limited to the described examples and other probe body 14 and the probing tip member 18 shapes and configurations may be employed with departing from the scope of the present invention. Likewise, the housing 30 of the hand-held probing adapter 10 has been described as configured for the shape of the measurement probing system 12 with top and bottom members 32, 34 and sidewalls 36, 38. The housing 30 may have a configuration and shape that is different from the shape of the measurement probing system 12. For example, the housing 30 may have a circular shape with the interior cavity 40 having rectangular first and second portions 46, 48 and a flared intermediate portion 72 for receiving a rectangular shaped probing head 14 and probing tip unit 18.

It will be obvious to those having skill in the art that many changes may be made to the details of the above-described embodiments of this invention without departing from the underlying principles thereof. The scope of the present invention should, therefore, be determined only by the following claims.

The invention claimed is:

1. An adapter for a measurement probing system having a probe body coupled to a probing tip member via at least a first coaxial cable comprising:
a housing having an interior cavity with the interior cavity exposed at openings in opposing ends of the housing, the interior cavity having a first portion for receiving the probe body and a second portion for receiving the probing tip member;
means for securing the probe body and the probing tip member in the housing with a portion of the probing tip member being exposed at the opening in the housing adjacent to the second portion of the interior cavity; and
compliant members disposed in the second portion of the interior cavity providing axial and lateral rotational movement of the probing tip member.

2. The adapter as recited in claim 1 wherein the housing further comprises first and second housing members with at least one of the housing members having a chamber defining the interior cavity of the housing.

3. The adapter as recited in claim 2 wherein the housing further comprises means for latching the first and second housing members together.

4. The adapter as recited in claim 2 wherein the first and second housing members comprise respective first and second shell halves with each shell half defining a portion of the interior cavity of the housing.

5. The adapter as recited in claim 4 wherein the housing further comprises means for latching the first and second shell halves together.

6. The adapter as recited in claim 5 wherein the latching means comprises interlocking latching members with each interlocking latching member having a first interlocking latching portion disposed with the first housing member and a second interlocking latching portion disposed with the second housing member.

7. The adapter as recited in claim 6 wherein the interlocking latching members comprise:
a pedestal having a notch formed therein extending from the interior cavity of one of the shell halves and a movable actuator disposed on the other of the shell halves having a hook member engaging the notch in the pedestal as the actuator is moved from a first position to a second position; and
notched beams disposed on one of the shell halves adjacent to and on opposing sides of the opening in the housing receiving the probing tip member and the other of the shell halves having recesses formed adjacent to and on opposing sides of the opening in the housing receiving the probing tip member wherein each of the notched beams on the one shell half receive one of the recesses in the other shell half.

8. The adapter as recited in claim 6 wherein the interlocking latching members are disposed on mating surfaces of the first and second shell halves with the first interlocking latching portion of each interlocking latching member extending upward from one of the mating surfaces and having a laterally extending hooked element formed therein and the second interlocking latching portion of each interlocking latching member being disposed in the second mating surface and having a chamber with a recessed shoulder, the laterally extending hooked element of the first latching portion engaging the shouldered chamber of the second latching portion as the mating surfaces of the first and second shell halves are brought together in mating contact and laterally moved from a first position to a second position.

9. The adapter as recited in claim 1 wherein the probe body has as least one of a slot and a rib disposed on an exterior surface of the probe body and the means for securing the probe body in the housing further comprises at least one of a rib and slot formed in the first portion of the interior cavity mating with the corresponding one of the slot and the rib disposed on the exterior surface of the probe body.

10. The adapter as recited in claim 1 wherein the probe body has as least one of a slot, apertures and protruding studs disposed on an exterior surface of the probe body and the means for securing the probe body in the housing further comprises at least one of protruding studs, apertures and a slot formed in the first portion of the interior cavity mating with the corresponding one of the slot, apertures and the protruding studs disposed on the exterior surface of the probe body.

11. The adapter as recited in claim 1 wherein the means for securing the probe body in the housing further comprises lateral protrusions extending into the interior cavity for capturing the probe body between the protrusions.

12. The adapter as recited in claim 1 wherein the probing tip member has at least a first slot formed therein and the means for securing the probing tip member in the housing further comprises at least a first pin disposed in the second portion of the interior cavity engaging the slot in the probing tip member.

13. The adapter as recited in claim 12 wherein the probing tip member has slots formed in opposing top and bottom surfaces and the means for securing the probing tip member in the housing further comprises pins disposed on opposing interior surfaces in the second portion of the interior cavity engaging the slots on the opposing top and bottom surfaces of the probing tip member.

14. The adapter as recited in claim 1 wherein the compliant members are disposed in the second portion of the interior cavity adjacent to opposing sides of the probing tip member.

15. The adapter as recited in claim 14 wherein each compliant member comprises a first portion engaging a rearward facing end face of a protrusion on each of the opposing sides of the probing tip member and a second portion engaging a side surface of the protrusion on each of the opposing sides of the probing tip member.

16. The adapter as recited in claim 15 wherein the compliant members are formed of an elastomeric material.

17. An adapter for measurement probing system having a probe body coupled to a probing tip member via at least a first coaxial cable comprising:
   a housing having first and second housing members with at least one of the housing members having a chamber defining the interior cavity of the housing with the interior cavity exposed at openings in opposing ends of the housing, the interior cavity having a first portion for receiving the probe body and a second portion for receiving the probing tip member;
   means for securing the probe body and the probing tip member in the housing with a portion of the probing tip member being exposed at the opening in the housing adjacent to the second portion of the interior cavity;
   compliant members disposed in the second portion of the interior cavity adjacent to opposing sides of the probing tip member having a first portion engaging a rearward facing end face of a protrusion on each of the opposing sides of the probing tip member and a second portion engaging a side surface of the protrusion on each of the opposing sides of the probing tip member that provide for axial and lateral rotation movement of the probing tip member; and
   interlocking latching members for securing the first and second housing members together.

18. The adapter as recited in claim 17 wherein the interlocking latching members comprise:
   a pedestal having a notch formed therein extending from the interior cavity of one of the shell halves and a movable actuator disposed on the other of the shell halves having a hook member engaging the notch in the pedestal as the actuator is moved from a first position to a second position; and
   notched beams disposed on one of the shell halves adjacent to and on opposing sides of the opening in the housing receiving the probing tip member and the other of the shell halves having recesses formed adjacent to and on opposing sides of the opening in the housing receiving the probing tip member wherein each of the notched beams on the one shell half receive the recesses in the shell half.

19. The adapter as recited in claim 17 wherein the probe body has as least one of a slot and a rib disposed on an exterior surface of the probe body and the means for securing the probe body in the housing further comprises at least one of a rib and slot formed in the first portion of the interior cavity mating with the corresponding one of the slot and the rib disposed on the exterior surface of the probe body.

20. The adapter as recited in claim 17 wherein the probe body has as least one of a slot, apertures and protruding studs disposed on an exterior surface of the probe body and the means for securing the probe body in the housing further comprises at least one of protruding studs, apertures and a slot formed in the first portion of the interior cavity mating with the corresponding one of the slot, apertures and the protruding studs disposed on the exterior surface of the probe body.

21. The adapter as recited in claim 17 wherein the means for securing the probe body in the housing further comprises lateral protrusions extending into the interior cavity for capturing the probe body between the protrusions.

22. The adapter as recited in claim 17 wherein the probing tip member has at least a first slot formed therein and the means for securing the probing tip member in the housing further comprises at least a first pin disposed in the second portion of the interior cavity engaging the slot in the probing tip member.

23. The adapter as recited in claim 22 wherein the probing tip member has slots formed in opposing top and bottom surfaces and the means for securing the probing tip member in the housing further comprises pins disposed on opposing interior surfaces in the second portion of the interior cavity engaging the slots on the opposing top and bottom surfaces of the probing tip member.

* * * * *